United States Patent
Okumoto

(10) Patent No.: US 10,324,339 B2
(45) Date of Patent: Jun. 18, 2019

(54) LIQUID CRYSTAL DISPLAY

(71) Applicant: Mitsubishi Electric Corporation, Tokyo (JP)

(72) Inventor: Kazunori Okumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/991,013

(22) Filed: May 29, 2018

(65) Prior Publication Data

US 2018/0356692 A1 Dec. 13, 2018

(30) Foreign Application Priority Data

Jun. 7, 2017 (JP) ................................. 2017-112294

(51) Int. Cl.
*G02F 1/1335* (2006.01)
*G02F 1/1343* (2006.01)
*H01L 27/12* (2006.01)

(52) U.S. Cl.
CPC .. *G02F 1/134309* (2013.01); *G02F 1/133512* (2013.01); *G02F 1/133514* (2013.01); *G02F 1/133528* (2013.01); *H01L 27/1214* (2013.01); *G02F 2001/133519* (2013.01); *G02F 2001/134372* (2013.01); *G02F 2201/121* (2013.01); *G02F 2201/123* (2013.01)

(58) Field of Classification Search
CPC ........................................... G02F 2001/134372
See application file for complete search history.

(56) References Cited

U.S. PATENT DOCUMENTS

| | | |
|---|---|---|
| 2002/0030780 A1 | 3/2002 | Nishida et al. |
| 2004/0252260 A1 | 12/2004 | Nishida et al. |
| 2005/0280755 A1 | 12/2005 | Nishida et al. |
| 2006/0274249 A1 | 12/2006 | Nishida et al. |
| 2009/0290080 A1 | 11/2009 | Horiuchi et al. |
| 2015/0378222 A1* | 12/2015 | Matsushima ..... G02F 1/134363 349/108 |

FOREIGN PATENT DOCUMENTS

| | | |
|---|---|---|
| JP | H10-133190 A | 5/1998 |
| WO | 2007/119454 A1 | 10/2007 |
| WO | 2014/038436 A1 | 3/2014 |

* cited by examiner

*Primary Examiner* — Phu Vu
(74) *Attorney, Agent, or Firm* — Studebaker & Brackett PC

(57) ABSTRACT

Provided is a technique for correcting a yellow shift to white. A liquid crystal display includes the following: a color filter substrate including a black matrix provided with a plurality of openings, and coloring materials of a plurality of colors disposed in the respective plurality of openings; an upper electrode having a plurality of slits for each opening; and a lower electrode. The plurality of colors include blue and two or more different colors other than blue. With respect to a first distance being a distance between an end of a drive region and an end of the opening corresponding to the plurality of slits, the first distance corresponding to the blue coloring material is different from the first distance corresponding to each of the coloring materials of the different colors.

9 Claims, 7 Drawing Sheets

LIQUID CRYSTAL DISPLAY

BACKGROUND OF THE INVENTION

Field of the Invention

The present invention relates to liquid crystal displays including black matrixes.

Description of the Background Art

Transverse electric-field liquid crystal displays having characteristics of a wide viewing angle have been widely used for vehicle-mounted liquid crystal displays, which are now in increasing demands. In the transverse electric-field mode, an electric field is formed between a pixel electrode and a counter electrode that are disposed on a thin-film-transistor (TFT) substrate, in parallel with a surface of a liquid crystal layer. Then, the directors (orientations) of liquid crystals are made to change to be almost parallel to the surface of the liquid crystal layer, thereby regulating the amount of transmitted light.

A typical liquid crystal display involves a color shift or a display color change when a viewer's view point is moved from a frontal direction to an oblique direction. Such a display color change in the transverse electric-field liquid crystal display results from a difference in accordance with a light wavelength, between light transmittance in the frontal direction and light transmittance in the oblique direction.

To prevent the display color change, Japanese Patent Application Laid-Open No. 10-133190 proposes a technique for regulating a cell gap for each Red/Green/Blue (hereinafter also referred to as RGB) in accordance with a representative wavelength of the RGB. The cell gap regulation by the use of the thicknesses of coloring material, as disclosed in Japanese Patent Application Laid-Open No. 10-133190, can be applied to the vehicle-mounted liquid crystal display, which imposes severe color specifications for RGB monochromatic display. This regulation however requires development in coloring materials satisfying restrictions on the thicknesses of the coloring materials while satisfying the severe specifications. This unfortunately raises costs.

Meanwhile, International Publication No. 2014/038436 proposes a technique for reducing the width of a BM's opening in a green pixel compared to those in red and blue pixels to thus prevent changes of a mixed color when viewed from an oblique direction.

International Publication No. 2014/038436 however is silent about a color change phenomenon in which white display in the mixed color is changed into yellow when viewed from the oblique direction (hereinafter, this phenomenon is also referred to as a yellow shift). Further, the technique of international Publication No. 2014/038436, i.e., the narrower BM's opening in the green pixel than the red and blue pixels, can unfortunately advance the yellow shift.

SUMMARY

In view of this problem, it is an object of the present invention to provide a technique for correcting a yellow shift to white.

An aspect of the present invention provides a liquid crystal display that includes the following: a color filter substrate including a black matrix provided with a plurality of openings, and coloring materials of a plurality of colors disposed in the respective plurality of openings; a thin-film-transistor substrate; and a liquid crystal layer. The thin-film-transistor substrate includes an upper electrode and a lower electrode disposed along the color filter substrate, the upper electrode having a plurality of slits for each opening, and the lower electrode disposed below the upper electrode. The liquid crystal layer is disposed between the color filter substrate and the thin-film-transistor substrate. The plurality of colors include blue and two or more different colors other than blue. With respect to a first distance being a distance between an end of a drive region in which a liquid crystal within the liquid crystal layer is driven by an electric field generated between the upper electrode and the lower electrode and an end of the opening corresponding to the plurality of slits of the upper electrode, the first distance corresponding to the blue coloring material is different from the first distance corresponding to each of the coloring materials of the different colors.

This enables obliquely travelling light in a blue pixel to be less reduced than obliquely travelling light in red and green pixels, thereby enabling the yellow shift to be corrected to white.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
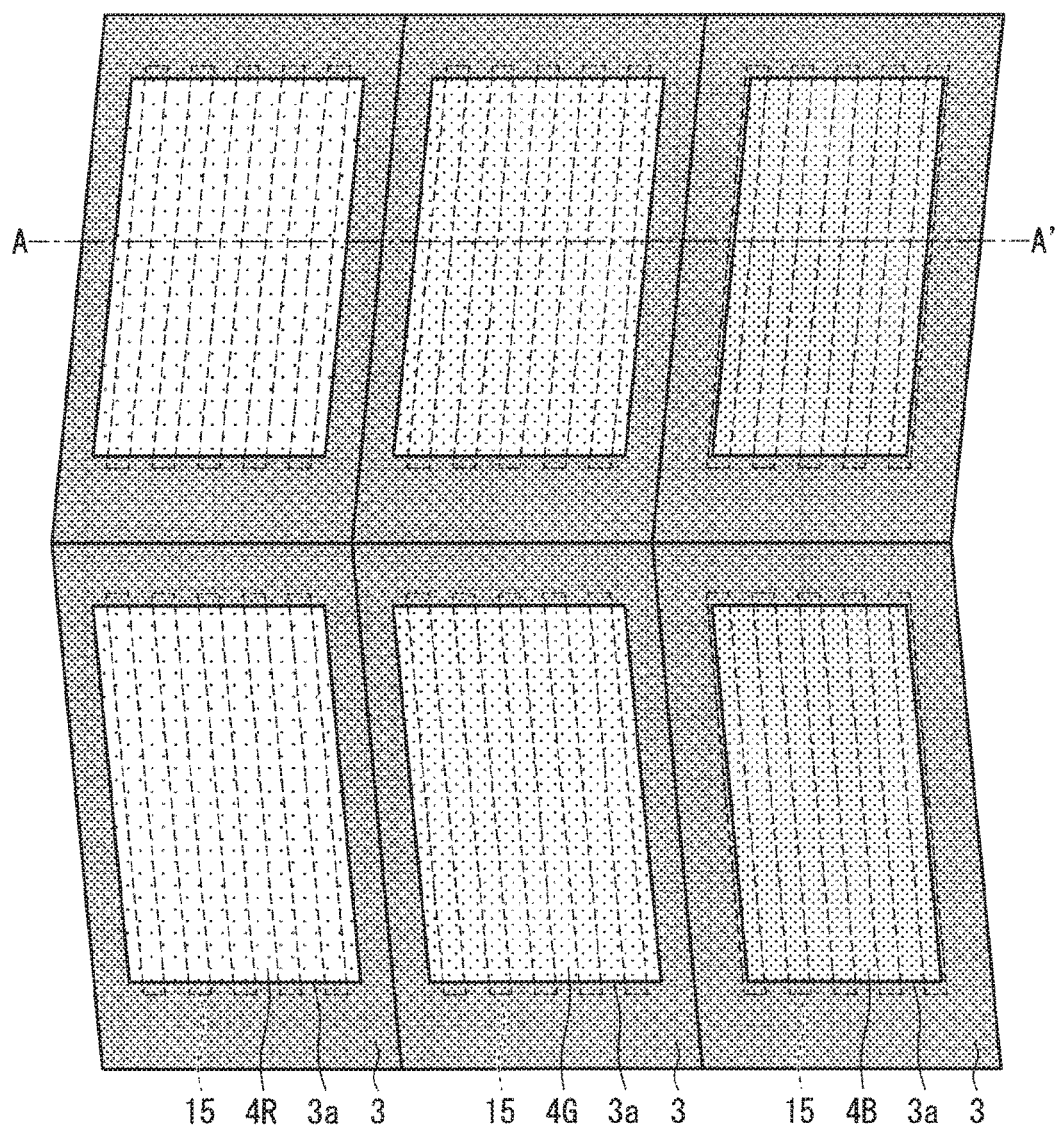
FIG. 1 is a schematic plan view of a configuration of a liquid crystal display according to a first preferred embodiment.
Figure 2:
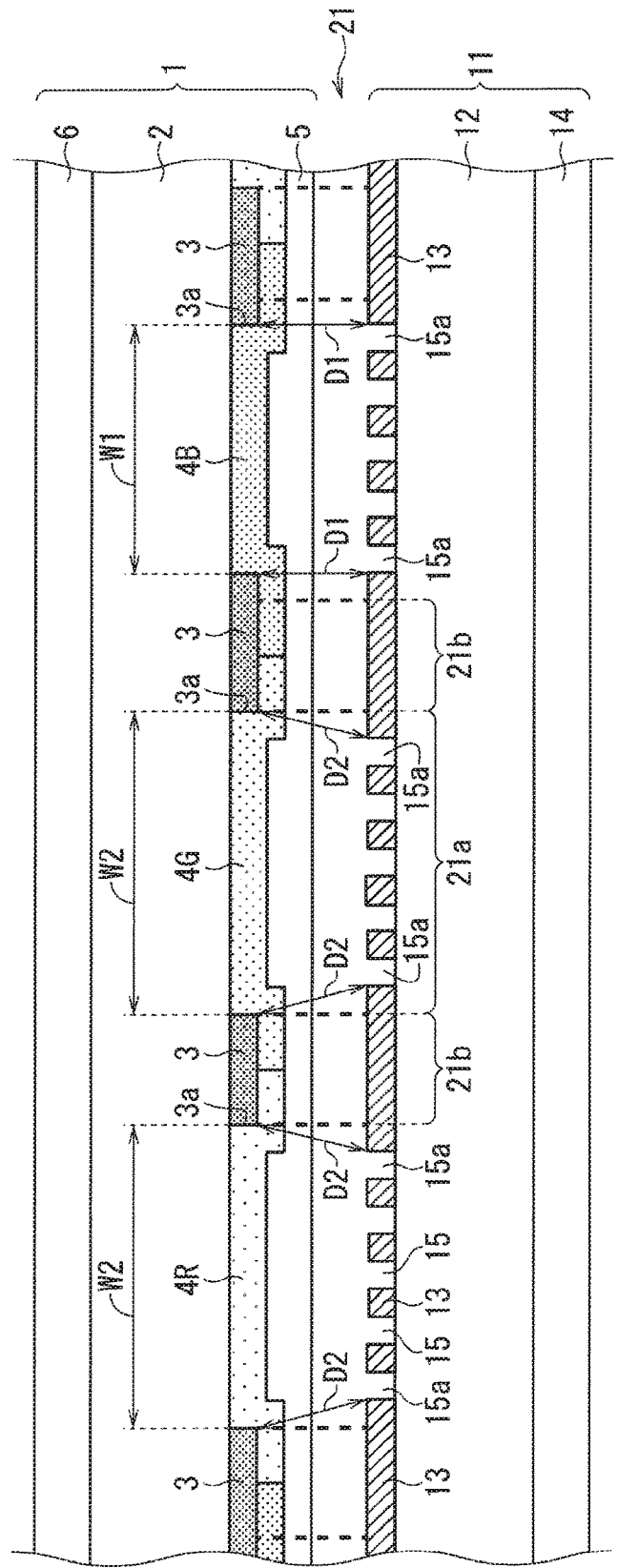
FIG. 2 is a schematic cross-sectional view of the configuration of the liquid crystal display according to the first preferred embodiment.

FIG. 1 is a schematic plan view of a configuration of a liquid crystal display according to a first preferred embodiment. FIG. 2 is a schematic cross-sectional view of the configuration taken along line A-A' in FIG. 1. Hereinafter, the liquid crystal display according to the first preferred embodiment is an active-matrix liquid crystal display in a fringe field switching (FFS) mode.

As illustrated in FIG. 2, the liquid crystal display includes a color filter substrate (CF substrate) 1 and a thin-film-transistor substrate (TFT substrate) 11, and a liquid crystal layer 21. The CF substrate 1 is a counter substrate facing the TFT substrate 11. The TFT substrate 11 is disposed along the CF substrate 1. The liquid crystal layer 21 is disposed between the CF substrate 1 and the TFT substrate 11. It is noted that a component consisting of the CF substrate 1, the TFT substrate 11, and the liquid crystal layer 21 is, hereinafter, also referred to as a panel.

The CF substrate 1 includes a transparent insulating substrate 2, a black matrix (BM) 3, coloring materials of a plurality of colors, an overcoat layer (OC layer) 5, a polarizer 6, and a columnar spacer, which is not shown. The coloring materials of the plurality of colors include a blue coloring material 4B and coloring materials of two or more different colors other than blue. The coloring materials of the two or more different colors, although being a green coloring material 4G and a red coloring material 4R in the first preferred embodiment, are not limited to these colors.

The BM 3 and the coloring materials 4R, 4G, and 4B are disposed on a main surface of the insulating substrate 2, the main surface being adjacent to the TFT substrate 11. The BM 3 has a plurality of openings 3a. The coloring materials 4R, 4G, and 4B are each disposed in the corresponding opening 3a in a frequency of every three spaces so as not to overlap each other.

The OC layer 5 covers the BM 3 and the coloring materials 4R, 4G, and 4B in a position close to the TFT substrate 11. The columnar spacer, which is not shown, is provided for allocating a desired space between the CF substrate 1 and the TFT substrate 11. The polarizer 6 is disposed on a main surface of the insulating substrate 2, the main surface being remote from the TFT substrate 11.

The TFT substrate 11 includes a transparent insulating substrate 12, a TFT, which is not shown, a lower electrode, which is not shown, an upper electrode 13, and a polarizer 14. The polarizer 14 is disposed on a main surface of the insulating substrate 12, the main surface being remote from the CF substrate 1.

As illustrated in FIGS. 1 and 2, the upper electrode 13 has a plurality of slits 15 for each opening 3a of the BM 3. The lower electrode is more adjacent to the insulating substrate 12 than the upper electrode 13, and is disposed below the upper electrode 13. In the FFS mode, the lower electrode is one of a pixel electrode and a counter electrode; moreover, the upper electrode 13 is the other one of the pixel electrode and the counter electrode. It is noted that the counter electrode corresponds to a common electrode. Further, although the planar arrangement of the lower electrode is not shown, the lower electrode is disposed in at least part of a region consisting of formation regions of the plurality of slits 15, provided for each opening 3a as earlier mentioned, and of regions between the plurality of slits 15. It is noted that the lower electrode may not be necessarily disposed at the extremities on both ends of the arrangement of the plurality of slits 15, particularly in locations extending off from the opening 3a of the BM 3.

In the FFS mode, controlling the TFT, which is not shown, produces a fringe electric field travelling inwardly within a surface of the liquid crystal layer 21, between the upper electrode 13 and the lower electrode disposed on a main surface of the insulating substrate 12, the main surface being close to the CF substrate 1. The fringe electric field drives liquid crystals contained in the liquid crystal layer 21, and changes the director orientations of the liquid crystals. In the FFS mode, the panel is in normally black state. Thus, the liquid crystal layer 21 has a region in which the fringe electric field drives the liquid crystals. This region corresponds to a transmission region through which light incident on the TFT substrate 11 is emitted from the CF substrate 1.

In the following description, the region of the liquid crystal layer 21, in which the fringe electric field generated between the upper electrode 13 and the lower electrode drives the liquid crystals, and which allows the light to be transmitted, is also referred to as a drive region 21a. The liquid crystal layer 21 also has a region in which the fringe electric field unlikely drives the liquid crystals, and that less allows light to be transmitted than the drive region 21a. In the following description, this region is also referred to as a non-drive region 21b.

Although more or less absorbed by the polarizer 6, light passing through a region of the non-drive region 21b, the region being near the drive region 21a. (hereinafter, also referred to as a peripheral drive region), and then reaching the polarizer 6, more or less passes through the polarizer 6. Meanwhile, light passing through a region of the non-drive region 21b, the region being relatively distant from the drive region 21a, and then reaching the polarizer 6, is generally absorbed by the polarizer 6 and then intercepted.

To improve light use efficiency, a red pixel provided with the red coloring material 4R and a green pixel provided with the green coloring material 4G are each configured such that a region for the opening 3a of the BM 3 is almost as large as the drive region 21a in the first preferred embodiment. That is, the red and green pixels are each configured such that the opening 3a of the BM 3 has ends located in almost the same position as the ends of the drive region 21a when viewed from a frontal direction of the panel (a thickness direction of the panel or a vertical direction of the drawing sheet of FIG. 2), as illustrated in FIG. 2.

In the first preferred embodiment, the lower electrode is basically disposed, in plan view, in the region consisting of the formation regions of the slits 15 and the regions between the plurality of slits 15. The lower electrode is thus disposed below all the formation regions of the slits 15 in a cross-sectional view of the individual slits 15. Hence, the positions of the ends of the drive region 21a are about several micro meters outside outermost slits 15a, being the outermost slits among the plurality of the slits 15, although more or less varying according to the thickness of the liquid crystal layer 21, a voltage for driving the liquid crystals, the shape of the slit 15 of the upper electrode 13, or other factors. Accordingly, each outermost slit 15a is designed in a position inside the drive region 21a from a location allocated for the end of the drive region 21a.

In contrast to the red and green pixels, a blue pixel provided with the blue coloring material 4B is configured such that a region for the opening 3a of the BM 3 is smaller than the drive region 21a. That is, the blue pixel is configured such that the opening 3a of the BM 3 has ends located inside the drive region 21a from the ends of the drive region 21a in the frontal view of the panel.

Here, a second distance between the slit 15a and the end of the opening 3a corresponding to the plurality of slits 15 is referred to as an end distance. The aforementioned configuration is described in the following another way using this end distance: an end distance D1 corresponding to the blue coloring material 4B is different from an end distance D2 corresponding to each of the red coloring material 4R and the green coloring material 4G. To achieve this configuration, a width W1 is narrower than a width W2 in the first preferred embodiment, where the width W1 is a width between an end of the opening 3a provided with the blue coloring material 4B and an end opposite the end, where the width W2 is a width between the end of the opening 3a provided with each of the red coloring material 4R and the green coloring material 4G, and an end opposite the end. Consequently, the end distance D1, corresponding to the blue coloring material 4B, is shorter than the end distance D2, corresponding to each of the red coloring material 4R and the green coloring material 4G. As a result, a first distance corresponding to the blue coloring material 4B is different from a first distance corresponding to each of the red coloring material 4R and the green coloring material 4G. Here, the first distance is a distance between each end of the drive region 21a, in which the electric field between the upper electrode 13 and the lower electrode drives the liquid crystals within the liquid crystal layer 21, and each end of the opening 3a corresponding to the plurality of slits 15 of the upper electrode 13.

Figure 3:
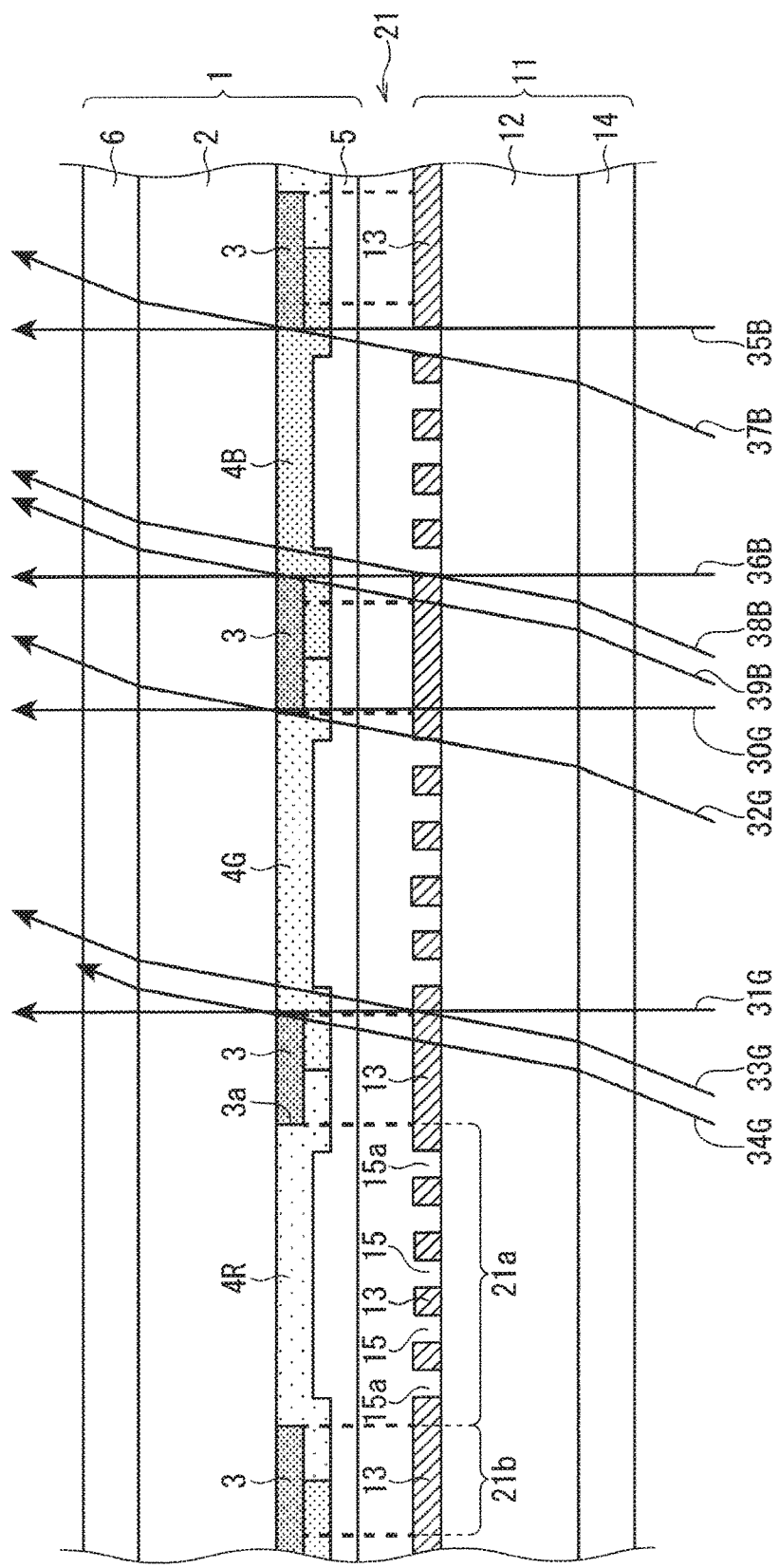
FIG. 3 is a diagram illustrating light passing through the liquid crystal display according to the first preferred embodiment.

FIG. 3 is a diagram illustrating light passing through the liquid crystal display according to the first preferred embodiment.

<Light Travelling in Frontal Direction of Panel>

As indicated by arrows 30G and 31G, the green pixel is configured such that part of light travelling in the frontal direction of the panel is intercepted by the BM 3, and that the remaining part of the light passes through the opening 3a of the BM 3 and the polarizer 6. This holds true for the red pixel. So does the blue pixel as indicated by arrows 35B and 36B.

As described above, the light traveling in the frontal direction of the panel receives generally the same action from the panel between the red, green, and blue pixels. Hence, the light travelling in the frontal direction of the panel has generally the same reduction degree between the red, green, and blue pixels, where the reduction degree is a degree to which light is reduced when passing through the panel.

<Obliquely Travelling Light>

The following describes obliquely travelling light with respect to the frontal direction of the panel. It is noted that the following description provides light travelling obliquely rightward with respect to the frontal direction of the panel. It is also noted that light travelling obliquely leftward with respect to the frontal direction of the panel arts in a manner reverse to the light travelling obliquely rightward described below.

As indicated by an arrow 32G, the right side of the green pixel is configured such that part of the light travelling obliquely rightward is intercepted by the BM 3, and that the remaining part of the light passes through the opening 3a of the BM 3 and the polarizer 6. This holds true for the right side of the red pixel. So does the right side of the blue pixel as indicated by an arrow 37B.

Light travelling obliquely rightward on the left side of the green pixel contains light (an arrow 33G) passing through the drive region 21a and light (an arrow 34G) passing through the peripheral drive region. Upon reaching the polarizer 6, the light (the arrow 34G) passing through the peripheral drive region more or less passes through the polarizer 6, but is more or less absorbed by the polarizer 6. Thus, the left side of the green pixel is configured such that part of the light travelling obliquely rightward is intercepted by the BM 3, and that the remaining part of the light is more or less absorbed by the polarizer 6 after passing through the opening 3a of the BM 3. This holds true for the left side of the red pixel.

Light travelling obliquely rightward on the left side of the blue pixel substantially contains only light (arrows 38B and 39B) passing through the drive region 21a. Thus, the left side of the blue pixel is configured such that part of the light passing through the opening 3a of the BM 3 and then travelling obliquely rightward is intercepted by the BM 3, and that the remaining part of the light is not substantially absorbed by the polarizer 6 after passing through the opening 3a of the BM 3.

As such, the polarizer 6 reduces the light passing through the peripheral drive region, the light being contained in the light travelling obliquely from the openings 3a, in the red and green pixels, but substantially fails to reduce the light travelling obliquely from the opening 3a in the blue pixel. Thus, the red and green pixels each have a larger reduction degree of the obliquely travelling light than the blue pixel.

Gist of First Preferred Embodiment

In the liquid crystal display according to the first preferred embodiment, the end distance D1, corresponding to the blue coloring material 4B, is different from the end distance D2, corresponding to each of the red coloring material 4R and the coloring material 4G, so that the first distance corresponding to the blue coloring material 4B is different from the first distance corresponding to each of the red coloring material 4R and the green coloring material 4G. To achieve this configuration, the width W1 (FIG. 2) between both ends of the opening 3a provided with the blue coloring material 4B is narrower than the width W2 between both ends of the opening 3a provided with each of the red coloring material 4R and the green coloring material 4G, in the first preferred embodiment.

Such a configuration enables the obliquely travelling light in the blue pixel to be less reduced than the obliquely travelling light in the red and green pixels. Consequently, the blue pixel has a smaller luminance reduction than the red and green pixels when a white display of the liquid crystal display is obliquely viewed. This achieves a blue shift or an action in which relatively intense blue makes the display blue. The blue shift enables a yellow shift to be corrected to white. Further, the liquid crystal display according to the first preferred embodiment, which is achieved through a change such as mask change in manufacture, probably prevents a cost increase involved in such a yellow-shift correction.

Modification of First Preferred Embodiment

As earlier mentioned, the liquid crystal display is configured such that the end distance D1 (FIG. 2), corresponding to the blue coloring material 4B, is shorter than the end distance D2, corresponding to each of the red coloring material 4R and the green coloring material 4G. To achieve this configuration, the width W1 (FIG. 2) between both ends of the opening 3a provided with the blue coloring material 4B is narrower than the width W2 between both ends of the opening 3a provided with each of the red coloring material 4R and the green coloring material 4G.

The above configuration is achieved in any other way. For instance, at least one of the shapes and the number of the plurality of slits 15 in the blue coloring material 4B may be different from at least one of the shapes and the number of the plurality of slits 15 in each of the red coloring material 4R and the green coloring material 4G. It is noted that the shape of each slit 15 includes the width, interval, and angle of the slit 15.

For a blue coloring material 4B having the same width as that of each of the red coloring material 4R and the green coloring material 4G, such a modification achieves a configuration in which the end distance D1, corresponding to the blue coloring material 4B, is different from the end distance D2, corresponding to each of the red coloring material 4R and the green coloring material 4G.

It is noted that although the BM 3 or the polarizer 6 intercepts light, the non-drive region fails to intercept light, as illustrated in FIG. 3. Accordingly, opaque films may be disposed in the non-drive regions 21b located at both ends of each of the red and green pixels to intercept, for instance, light between the arrows 33G and 34G in FIG. 3.

The end distance D2 corresponding to red is the same as the end distance D2 corresponding to green in the first preferred embodiment. An end distance corresponding to red may be different from an end distance corresponding to green.

Second Preferred Embodiment

Figure 4:
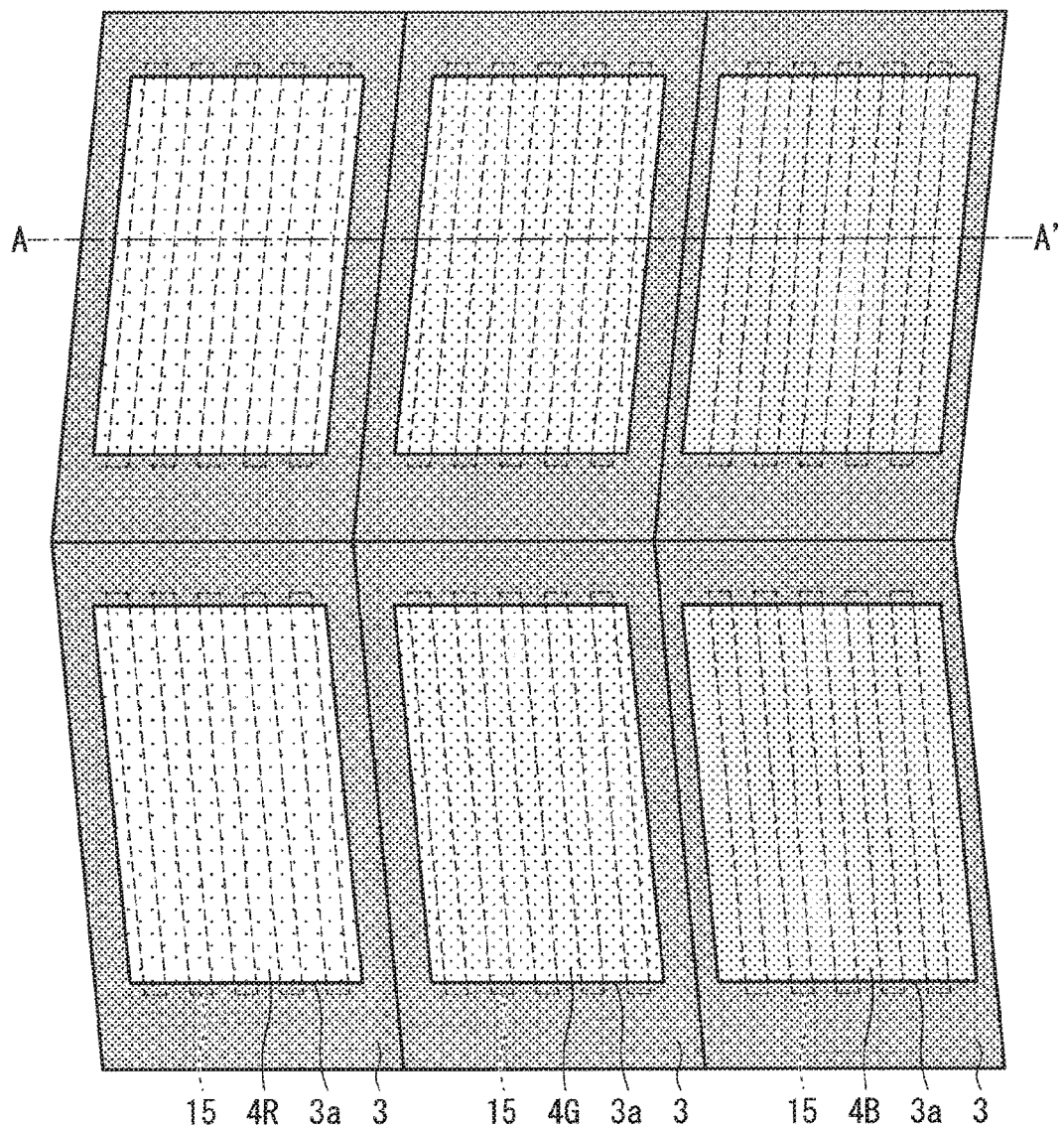
FIG. 4 is a schematic plan view of a configuration of a liquid crystal display according to a second preferred embodiment.
Figure 5:
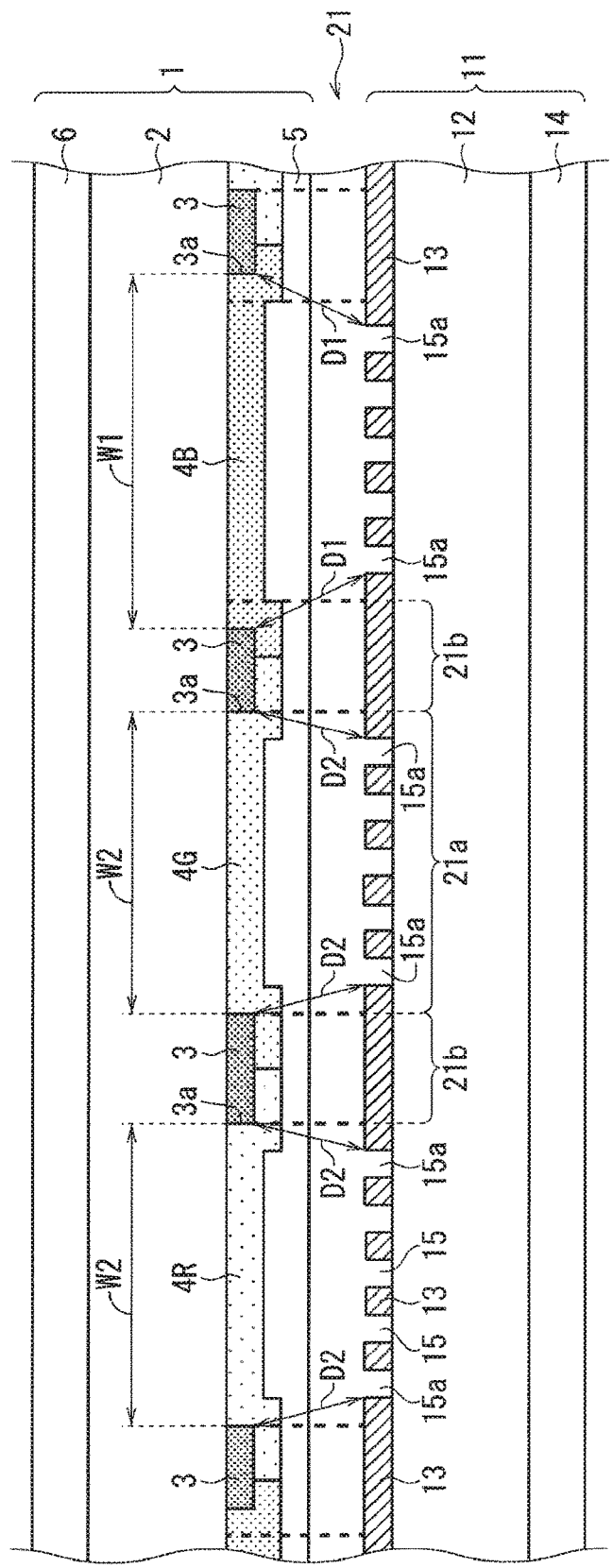
FIG. 5 is a schematic cross-sectional view of the configuration of the liquid crystal display according to the second preferred embodiment.

FIG. 4 is a schematic plan view of a configuration of a liquid crystal display according to a second preferred embodiment. FIG. 5 is a schematic cross-sectional view of the configuration taken along line A-A' in FIG. 4. It is noted that identical or similar components between the liquid crystal display in the first preferred embodiment and the liquid crystal display in the second preferred embodiment are denoted by the same reference symbols, and that mainly described herein are different components between these liquid crystal displays.

Like the corresponding configuration in the first preferred embodiment, the liquid crystal display in the second preferred embodiment is configured such that an end distance D1 corresponding to a blue coloring material 4B is different from an end distance D2 corresponding to each of a red coloring material 4R and a green coloring material 4G so that a first distance corresponding to the blue coloring material 4B is different from a first distance corresponding to each of the red coloring material 4R and the green coloring material 4G. To achieve this configuration, a width W1 between an end of an opening 3a provided with the blue coloring material 4B and an end opposite the end is wider than a width W2 between an end of an opening 3a provided with each of the red coloring material 4R and the green coloring material 4G, and an end opposite the end. Thus, the end distance D1, corresponding to the blue coloring material 4B, is longer than the end distance D2, corresponding to each of the red coloring material 4R and the green coloring material 46.

Figure 6:
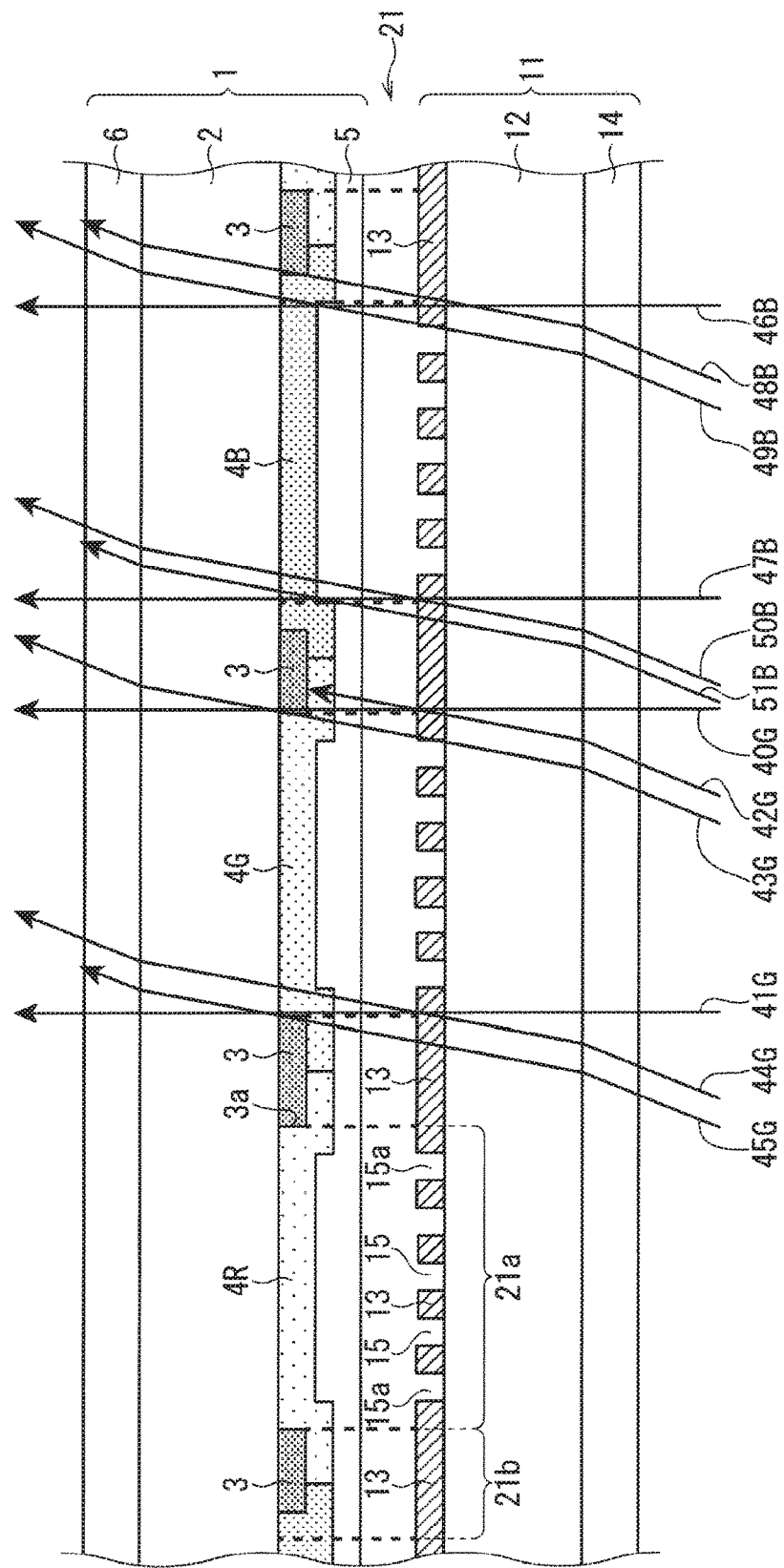
FIG. 6 is a diagram illustrating light passing through the liquid crystal display according to the second preferred embodiment.

FIG. 6 is a diagram illustrating light passing through the liquid crystal display according to the second preferred embodiment.

<Light Travelling in Frontal Direction of Panel>

As indicated by arrows 40G and 41G, a green pixel is configured such that part of light travelling in a frontal direction of a panel is intercepted by a non-drive region 21b, and that the remaining part of the light passes through a drive region 21a and a polarizer 6. This holds true for a red pixel. So does a blue pixel as indicated by arrows 46B and 47B.

As described above, the light traveling in the frontal direction of the panel receives generally the same action from the panel between the red, green, and blue pixels. Hence, the light travelling in the frontal direction of the panel has generally the same reduction degree between the red, green, and blue pixels.

<Obliquely Travelling Light>

The following describes obliquely travelling light with respect to the frontal direction of the panel. It is noted that the following description provides light travelling obliquely rightward with respect to the frontal direction of the panel.

It is also noted that light travelling obliquely leftward with respect to the frontal direction of the panel acts in a manner reverse to the light travelling obliquely rightward described below.

The left side of the green pixel is configured such that light (an arrow 45G) passing through a peripheral drive region, the light (the arrow 45G) contained in light (an arrow 44G and the arrow 45G) travelling obliquely rightward, more or less passes through a polarizer 6, but is more or less absorbed by the polarizer 6. This holds true for the left side of the red pixel. So does the left side of the blue pixel as indicated by arrows 50B and 51B.

Light travelling obliquely rightward on the right side of the green pixel contains light (an arrow 43G) passing through the drive region 21a and light (an arrow 42G) passing through the peripheral drive region. The light (the arrow 42G) passing through the peripheral drive region on the right side of the green pixel, if reaching the polarizer 6, more or less would pass through the polarizer 6. However, this light (the arrow 42G) is intercepted by a BM 3 before reaching the polarizer 6. This holds true for light on the left side of the red pixel.

Light travelling obliquely rightward on the right side of the blue pixel contains light (an arrow 49B) passing through the drive region 21a and light (an arrow 48G) passing through the peripheral drive region. The light (the arrow 48B) passing through the peripheral drive region on the right side of the blue pixel reaches the polarizer 6 without being intercepted by the BM 3, and then more or less passes through the polarizer 6.

As such, the BM 3 intercepts the light passing through the peripheral drive region, the light being contained in the obliquely travelling light in the red and green pixels, but fails to intercept the obliquely travelling light in the blue pixel. Hence, the red and green pixels each have a larger reduction degree of the obliquely travelling light than the blue pixel.

Gist of Second Preferred Embodiment

In the liquid crystal display according to the second preferred embodiment, the end distance D1, corresponding to the blue coloring material 4B, is different from the end distance D2, corresponding to each of the red coloring material 4R and the green coloring material 4G. To achieve this configuration, the width W1 (FIG. 5) between both ends of the opening 3a provided with the blue coloring material 4B is wider than the width W2 between both ends of the opening 3a provided with each of the red coloring material 4R and the green coloring material 4G, in the second preferred embodiment.

Such a configuration enables the obliquely travelling light in the blue pixel to be less reduced than the obliquely travelling light in the red and green pixels. This achieves a blue shift, thereby enabling a yellow shift to be corrected to white in a manner similar to the blue shift in the first preferred embodiment. Further, the liquid crystal display according to the second preferred embodiment, which is achieved through a change such as mask change in manufacture, probably prevents a cost increase involved in such a yellow-shift correction.

Modification of Second Preferred Embodiment

In the liquid crystal display in the second preferred embodiment, at least one of the shapes and the number of a plurality of slits 15 in the blue coloring material 4B may be different from at least one of the shapes and the number of the plurality of slits 15 in each of the red coloring material 4R and the green coloring material 4G, in a manner similar to the liquid crystal display in the modification of the first preferred embodiment. For a blue coloring material 4B having the same width as that of each of the red coloring material 4R and the green coloring material 4G, such a modification achieves a configuration in which the end distance D1, corresponding to the blue coloring material 4B, is different from the end distance D2, corresponding to each of the red coloring material 4R and the green coloring material 4G.

In the second preferred embodiment, opaque films may be disposed in sites of the non-drive regions 21b located at both ends of each of the red and green pixels, the sites exerting no influence on the action of the second preferred embodiment, to thus intercept light, in a manner similar to the modification of the first preferred embodiment.

The end distance D2 corresponding to red is the same as the end distance D2 corresponding to green in the second preferred embodiment. An end distance corresponding to red may be different from an end distance corresponding to green.

Third Preferred Embodiment

Figure 7:
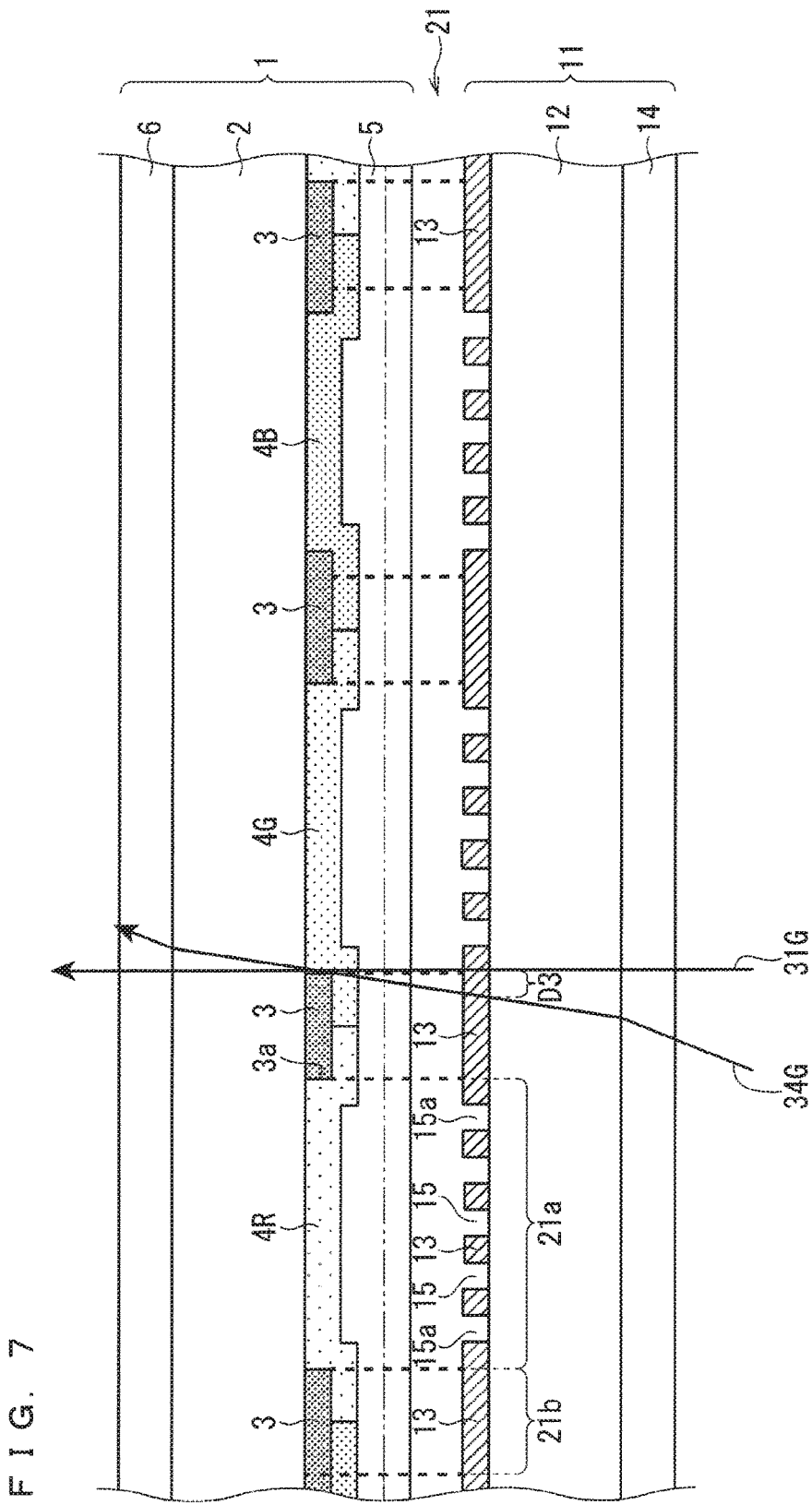
FIG. 7 is a schematic cross-sectional view of a configuration of a liquid crystal display according to a third preferred embodiment.

FIG. 7, similarly to FIG. 2, is a schematic cross-sectional view of a configuration of a liquid crystal display according to a third preferred embodiment of the present invention. Further, FIG. 7 illustrates, similarly to FIG. 3, light passing through the liquid crystal display according to the third preferred embodiment. It is noted that identical or similar components between the liquid crystal displays in the aforementioned preferred embodiments and the liquid crystal display in the third embodiment are denoted by the same reference symbols, and that mainly described herein are different components between these liquid crystal displays.

The thickness of an OC layer 5 in the third preferred embodiment is different from that in the first preferred embodiment. To be specific, the thickness of the OC layer 5 in the third preferred embodiment is thickener than the thickness (indicated by a chain double-dashed line in FIG. 7) of the OC layer 5 in the first preferred embodiment, and is 2 μm or more. It is noted that the OC layer 5 preferably has a thickness of about 5 μm or less when applied for formation through a publicly known method such as a spin-coating method, in order to obtain a practically permissible thickness distribution. The thickness of the OC layer 5 herein is set to be about 2.5 μm as one example.

Reference is made to light passing through the end of an opening 3a of a BM 3. As illustrated in FIG. 7, light (an arrow 31G) travelling in a frontal direction passes through one location on an upper surface of the TFT substrate 11; moreover, obliquely travelling light (an arrow 34G) passes through another location on the upper surface of the TFT substrate 11. An oblique loss width D3 that is a distance between these locations depends not only on an oblique direction of the obliquely travelling light (the arrow 34G), but also on the thicknesses and refractive indexes of coloring materials, the OC layer 5, an alignment film, which is not shown, and a liquid crystal layer 21.

Here, the description in the first preferred embodiment clarifies that the amount (degree) of a blue shift in white depends on the ratio of the oblique loss width D3 to the opening 3a. Accordingly, a large oblique loss width D3 enhances the blue shift.

In view of this fact, the liquid crystal display according to the third preferred embodiment is configured such that the OC layer 5 has a thickness of 2 μm or more. Such a configuration relatively increases the oblique loss width D3. The oblique loss width D3 thus increases. This enhances the correction of a yellow shift to white. In addition, the increase in thickness of the OC layer 5 requires no particular process. This probably prevents a cost increase involved in the correction.

The aforementioned description provides an example in which the liquid crystal display according to the first preferred embodiment includes the thicker OC layer 5. The liquid crystal display according to the second preferred embodiment can include a thicker OC layer 5 to thus achieve a similar effect.

<Other Modifications>

As described in the first to third preferred embodiments and their modifications, the ends of the drive region 21a correspond to the outer ends of the outermost slits 15a in a configuration in which the lower electrode is disposed all over the formation regions of all the slits 15. Accordingly, established is a relationship between the end distance D1, corresponding to the blue coloring material 4B, and the end distance D2, corresponding to each of the red coloring material 4R and the green coloring material 4G, relative to the end of the outermost slit 15a. However, the end of the drive region 21a does not correspond to the outer end of the outermost slit 15a in a configuration in which the lower electrode does not disposed all over the formation regions of all the slits 15.

For instance, the end of the drive region 21a corresponds to the end of the lower electrode in a configuration in which the end of a formation region of the lower electrode is inside the end of the outermost slit 15a. In such a configuration, with respect to a third distance being a distance between the end being on the outermost slit side of the plurality of slits 15, of the lower electrode, and the end of the opening 3a corresponding to the plurality of slits 15, the third distance corresponding to the blue coloring material 4B needs to be different from the third distance corresponding to each of the red coloring material 4R and the green coloring material 4G. That is, an effect is achieved that is similar to a basic effect achieved in the individual preferred embodiments when the end distances D1 and D2 is replaced with the third distance between the end of the lower electrode and the end of the opening 3a in the first to third preferred embodiments and their modifications.

The first to third preferred embodiments and their modification describe that the end of the BM 3 disposed between the coloring materials of different colors from each other is configured such that positions of the end of the opening 3a of the BM 3 vary according to colors, in a configuration in which the plurality of slits 15 provided for each opening 3a of the BM 3 extend along a direction in which the BM 3 disposed between the coloring materials of different colors from each other extends. That is, the position of the end of the opening 3a of the BM 3 is adjusted to satisfy the above configuration, relative to the outermost slit 15a.

However, positional relationships between the end of the drive region 21a, formed by the plurality of slits 15 and the lower electrode, and the end of the opening 3a of the BM 3 are basically required to vary according to colors. Hence, the positions of the ends of the opening 3a of the BM 3, the ends being in the vicinity of the extremities of both ends of the plurality of slits 15 may be adjusted to satisfy the above configuration relative to the ends of the drive region 21a, the ends being in the vicinity of the extremities of both ends of the plurality of the slits 15. Further, the outermost slit 15a may not be necessarily a reference in the positional adjustment of the end of the opening 3a. In view of this fact, positions of the end of the opening 3a of the BM 3 may vary according to colors, with regard to the end of the BM 3 disposed between coloring materials of the same color. That is, the position of the end of the opening 3a of the BM 3 needs to be determined as necessary in accordance with the position of the end of the drive region 21a, formed by the plurality of slits 15 and the lower electrode, regardless of the arrangement or shapes per se of the plurality of slits 15.

It is noted that in the present invention, the individual embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A liquid crystal display comprising:
    a color filter substrate comprising a black matrix provided with a plurality of openings, and coloring materials of a plurality of colors disposed in the respective plurality of openings;
    a thin-film-transistor substrate comprising an upper electrode and a lower electrode disposed along the color filter substrate, the upper electrode having a plurality of slits for each opening, the lower electrode being disposed below the upper electrode; and
    a liquid crystal layer disposed between the color filter substrate and the thin-film-transistor substrate,
    wherein the plurality of colors comprises blue and two or more different colors other than blue, and
    wherein with respect to a first distance being a distance between an end of a drive region in which a liquid crystal within the liquid crystal layer is driven by an electric field generated between the upper electrode and the lower electrode and an end of the opening corresponding to the plurality of slits of the upper electrode, the first distance corresponding to the blue coloring material is different from the first distance corresponding to each of the coloring materials of the different colors.

2. The liquid crystal display according to claim 1, wherein with respect to a second distance being a distance between an outermost slit of the plurality of slits and the end of the opening corresponding to the plurality of slits, the second distance corresponding to the blue coloring material different from the second distance corresponding to each of the coloring materials of the different colors.

3. The liquid crystal display according to claim 1, wherein with respect to a third distance being a distance between an end being on an outermost slit side of the plurality of slits, of the lower electrode, and the end of the opening corresponding to the plurality of slits, the third distance corresponding to the blue coloring material is different from the third distance corresponding to each of the coloring materials of the different colors.

4. The liquid crystal display according to claim 1, wherein a width between the end of the opening in which the blue coloring material is disposed, and an end opposite the end is narrower than a width between the end of the opening in which each of the coloring materials of the different colors is disposed, and an end opposite the end.

5. The liquid crystal display according to claim 1, wherein a width between the end of the opening in which the blue coloring material is disposed, and an end opposite the end is wider than a width between the end of the opening in which each of the coloring materials of the different colors is disposed, and an end opposite the end.

6. The liquid crystal display according to claim 1, wherein at least one of shapes and the number of the plurality of slits in the blue coloring material is different from at least one of shapes and the number of the plurality of slits in each of the coloring materials of the different colors.

7. The liquid crystal display according to claim 1, wherein the different colors comprises green.

8. The liquid crystal display according to claim 1,
    wherein the color filter substrate further comprises an overcoat layer covering the black matrix and the coloring materials of the plurality of colors on a thin-film-transistor substrate side, and
    wherein the overcoat layer has a thickness of 2 μm or more.

9. The liquid crystal display according to claim 8, wherein the overcoat layer has a thickness of 5 μm or less.

* * * * *